United States Patent [19]

De Bruyne et al.

[11] 4,207,584
[45] Jun. 10, 1980

[54] SAFETY DEVICE FOR PROTECTING SEMICONDUCTOR COMPONENTS AGAINST EXCESSIVE VOLTAGE RISE RATES

[75] Inventors: Patrick De Bruyne, Siggenthal; Roland Sittig, Umiken, both of Switzerland

[73] Assignee: BBC Brown, Boveri & Company, Limited, Baden, Switzerland

[21] Appl. No.: 7,183

[22] Filed: Jan. 29, 1979

Related U.S. Application Data

[63] Continuation of Ser. No. 713,134, Aug. 10, 1976, abandoned.

[30] Foreign Application Priority Data

Sep. 25, 1975 [CH] Switzerland ............... 12465/75

[51] Int. Cl.² .................................. H01L 29/74
[52] U.S. Cl. .............................. 357/38; 357/56; 307/252 K
[58] Field of Search ............... 357/38, 55, 22, 43, 357/56; 307/252 A, 252 J, 252 K, 252 Q

[56] References Cited
U.S. PATENT DOCUMENTS 3,641,404  2/1972  Svedberg ...................... 307/252 Q

FOREIGN PATENT DOCUMENTS 1071632  6/1967  United Kingdom ................ 357/38

Primary Examiner—Joseph E. Clawson, Jr.
Attorney, Agent, or Firm—Oblon, Fisher, Spivak, McClelland & Maier

[57] ABSTRACT

A safety device for protecting a controllable high power semiconductor component having an anode, a cathode, and a control electrode, against excessive voltage rise rates dU/dt and comprising: a semiconductor body having at least four sequential zones of alternating and opposite conductivity type, the second sequential zone being provided with a high concentration region having a higher concentration of conductivity type determining impurities than the rest of the second sequential zone; a first emitter electrode contacting the first of the four sequential zones of the semiconductor body and adapted to be connected to the control electrode of the controllable high power semiconductor component; a second emitter electrode contacting the fourth of the four sequential zones of the semiconductor body and adapted to be connected to the anode of the controllable high power semiconductor component; a gate electrode contacting the high concentration region of the second sequential zone of the semiconductor body; and an ohmic conductor connected between the first emitter electrode and the gate electrode.

4 Claims, 6 Drawing Figures

SAFETY DEVICE FOR PROTECTING SEMICONDUCTOR COMPONENTS AGAINST EXCESSIVE VOLTAGE RISE RATES

This is a continuation of application Ser. No. 713,134 filed Aug. 10, 1976, now abandoned.

BACKGROUND OF THE INVENTION

1. Field of the Invention

The invention concerns a safety device for controllable high-power semiconductor components to protect them against too high rates of voltage increase dU/dt, and a method of producing such a safety device.

2. Description of the Prior Art

When thyristors are incorporated in electrical circuits they are either provided with a normal load far under the permissible limit or must be protected by a special circuit. This is particularly important in high-voltage rectifiers in which multiple series connections of thyristors are used, because in such installations there is very great danger of an unequal and excessive loading of individual thyristors.

The voltage applied to the thyristor is limited by RC-elements (cf. e.g. H. Laber: "High-voltage rectifiers with thyristors", Siemens Zeitschrift 47 (1973), p. 823 ff.) and/or by semiconductor voltage limiters (cf. e.g. Brown Boveri Mitteilungen 1972, p. 476 ff.).

H. Laber's article also tells how to protect against too rapid voltage rises dU/dt that also can cause unwanted firing of the thyristors, by suitable choice of capacitances or inductances.

SUMMARY OF THE INVENTION

It is an object of the present invention to develop a dU/dt safety device for controllable high-power semiconductor elements, or thyristors, that is simple and economical to produce and that considerably simplifies the special circuitry for protecting the thyristor.

The foregoing and other objects are achieved in accordance with one aspect of the present invention through the provision of a safety device for protecting a controllable high power semiconductor component having an anode, a cathode, and a control electrode, against excessive voltage rise rates dU/dt and comprising: a semiconductor body having at least four sequential zones of alternating and opposite conductivity type, the second sequential zone being provided with a high concentration region having a higher concentration of conductivity type determining impurities than the rest of the second sequential zone; a first emitter electrode contacting the first of the four sequential zones of the semiconductor body and adapted to be connected to the control electrode of the controllable high power semiconductor component; a second emitter electrode contacting the fourth of the four sequential zones of the semiconductor body and adapted to be connected to the anode of the controllable high power semiconductor component; a gate electrode contacting the high concentration region of the second sequential zone of the semiconductor body; and an ohmic conductor connected between said first emitter electrode and the gate electrode.

The invention basically relies on the fact that when a voltage rise rate dU/dt exceeds a prescribed value, a special protective element, or a module consisting of a number of such protective elements connected in series, situated between the anode and the control electrode ("gate") of the thyristor to be protected, switches on and thus supplies a gating current which fires the thyristor normally, before it can be destroyed by firing because of too high a voltage rise rate.

BRIEF DESCRIPTION OF THE DRAWINGS

Various objects, features and attendant advantages of the present invention will be more fully appreciated as the same becomes better understood in connection with the accompanying drawings, in which.

DETAILED DESCRIPTION OF THE PREFERRED EMBODIMENT

Figure 1:
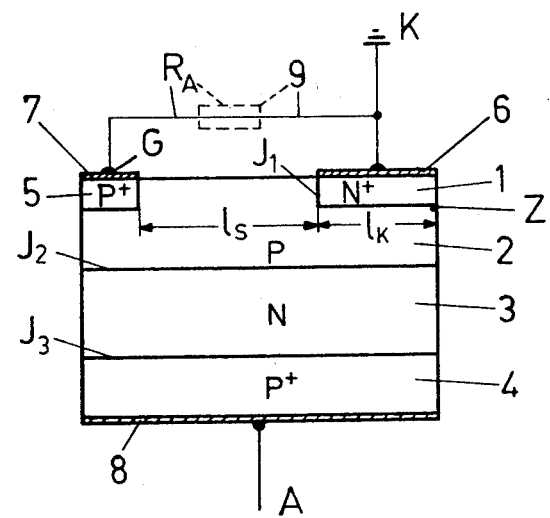
FIG. 1 shows a section through the semiconductor element of a safety device conforming to the invention.

Referring now to the drawings, wherein like reference symbols designate identical or corresponding parts throughout the several views, and more particularly to FIG. 1 thereof, FIG. 1 shows a section through a semiconductor element of a safety device conforming to the invention with an N+PNP+ zone sequence. The N+ zone (the first emitter) is indicated here by 1, the P zone (base zone) by 2, the N zone by 3 and the P+ zone (the second emitter) by 4. The zones 1, 2 and 4 are provided with contact surfaces 6, 7 and 8. Under the contact surface 7 the P zone 2 has a region 5 of increased doping (gate zone).

Figure 2:
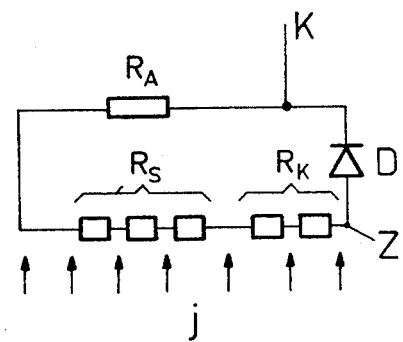
FIG. 2 is an equivalent-circuit diagram for part of the semiconductor element of FIG. 1.

To explain the operation of the new component, let the cathode K be grounded and the contact surface 7 of P zone 2 be connected by an electrically conducting path 9 (short circuit or resistor) to cathode K. With a rise at constant dU/dt of the voltage between anode A and cathode K, the transition zone $J_2$ is reverse biased and a depleting region is established at the junction $J_2$. The leaving charge carriers produce a current:

$$i = C(dU/dt)$$

where C is the space charge capacity of the junction $J_2$, which itself depends on the applied voltage. (In explaining the operation, the capacity C as well as the current density j of this capacitive current can be assumed constant). For the upper part of the component shown in FIG. 1 we then have the equivalent circuit of FIG. 2. The diode D represents the PN junction $J_1$, between the N+ zone 1 and the P zone 2; the resistor $R_K$ represents the lateral resistance in the P zone 2 underneath the N+ zone 1 and the resistor $R_s$ that between N+ zone 1 and P+ region 5; the external connection 9 from gate G to cathode K is represented by resistor $R_A$. The N+ zone 1 and the P+ region 5 can be considered equipotential surfaces, so that the greatest potential difference arises in junction $J_1$ at point Z. It amounts to:

$$U_z = \tfrac{1}{2} j (R_K l_k^2 + R_s l_s^2) + i R_A \tag{1}$$

where:

$$R_k = \left( \int_{z_K}^{z_T} \sigma(z)dz \right)^{-1}$$

$$R_s = \left( \int_{O}^{z_T} \sigma(z)dz \right)^{-1}$$

$\sigma(z)$ = specific conductivity at a depth Z within the P zone 2
$z_K$ = penetration depth in the N+ zone 1
$z_T$ = penetration depth in the P zone 2
$l_K$ = width of the N+ zone 1
$l_s$ = distance between the N+ zone 1 and the P+ region 5

$$j = \frac{i}{F} = \frac{c}{F} \frac{dU}{dt}$$

F = area of the transition zone $J_2$

From this formula it is seen how to establish the necessary voltage $U_z$ at junction $J_1$ for firing at a definite selected dU/dt:

For a given P-profile, and thus for given resistors $R_k$ and $R_s$, there are the following possibilities:

1. $R_A$ is made practically o (short circuit) and $l_K$ and $l_s$ are adjusted correspondingly, or
2. $l_K$ and $l_s$ are chosen so small that the voltage drop in the silicon is not enough and firing is adjusted by means of the resistor $R_A$.

The advantage of option 1 is that fabrication is particularly simple. Subsequent adjustment of the exact firing level, however, is only possible by increasing the value of resistance $R_s$ by means of trench etching. In option 2, in contrast, the exact firing level is adjustable in the finished element.

Protective elements of this type can be connected in series. As soon as a rising voltage fires one element, the voltage rise rate is increased for the rest so that all the elements switch on. Since the operating conditions must then be satisfied only by the module consisting of several elements, greater tolerances are permissible for the individual elements.

In the following there is described, by way of example, the construction of a module for protecting a thyristor with a voltage strength of 3.2 kv against voltage rise rates faster than 600 V/μs. To satisfy these requirements a module consisting of three protective elements is provided. Then the individual element must be able to block 1.2 KV in the forward direction and switch on at a dU/dt of 200 V/μs.

Since production of the protective elements is quite cheap, an optimized edge chamfer is dispensed with. So that the element may have, nevertheless, a sufficiently high voltage strength, the doping concentration in the N zone 3 should be chosen to be relatively low, so that the field strength everywhere at the PN junction $J_2$ and therefore also at the surface remains small when the maximum voltage of 1.2 KV is applied. Experience shows that field strengths up to $1.3 \times 10^5$ V/cm are permissible at the surface. To avoid exceeding this value at 1.2 KV, the breakdown voltage in the interior of the element must be about 3 KV. This implies a doping concentration in the N zone 3 of $N_D = 5 \times 10^{13}$ cm$^{-3}$ ($\approx 100\Omega$ cm). On the other hand, in order to give better protection against firing by a punch-through effect at a voltage of 1.2 KV, the thickness of the N zone is chosen to be about 350 μm.

For the P zone 2 and the P+ zone 4 a standard acceptor profile is diffused in, the depth of penetration being about 70 μm and the surface concentration about $10^{17}$ cm$^{-3}$. Next, a boron profile about 20 μm deep is diffused into the whole anode side and the region 5 of P zone 2 to be contacted later, the surface concentration being higher than $10^{20}$ cm$^{-3}$.

Subsequently, the N+ zone 1 is produced by inward diffusion of phosphorus impurities. For the lateral resistances in P zone 2 we thus have under N+ zone 1 an $R_K$ of 230Ω and between the N+ zone and the gate zone an $R_s$ of 100Ω.

At a voltage of 30 v the capacity of junction $J_2$ is:

$$c = 0.4 \; F(nF/cm^2 \cdot cm^2)$$

resulting in a current density $j = 8 \times 10^{-2}$ A/cm$^2$ for a voltage rise rate of 200 V/μs.

Considering that the appearance of a potential difference of about 0.6 V in the forward direction at a point of the PN junction $J_1$ is a good approximation to the firing condition of the thyristor (cf. e.g. J. Burtscher, E. Spenke: Siemens Forschungs and Entwicklungs Bericht, vol. 3 (1974); p. 235), then with $R_A = 0$, $l_K$ and $l_s$ can be chosen so that equation (1) is satisfied:

$$U_z = 0.6 \; V = \tfrac{1}{2} \times 8 \times 10^{-2}(230 \; l_K^2 + 100 \; l_s^2) \qquad (V)$$

For Example $l_K = 2.0$ mm and $l_s = 2.4$ mm.

Figure 3:
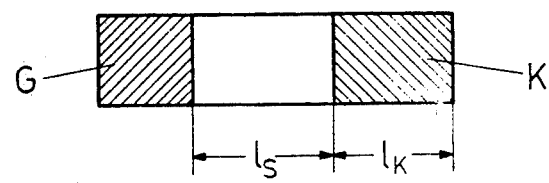
FIG. 3 is a plan view of the semiconductor element of FIG. 1.

There result then, by way of example, rectangular elements about $6 \times 1.5$ mm$^2$ in size. The plan view of such an element is shown in FIG. 3.

Figure 4:
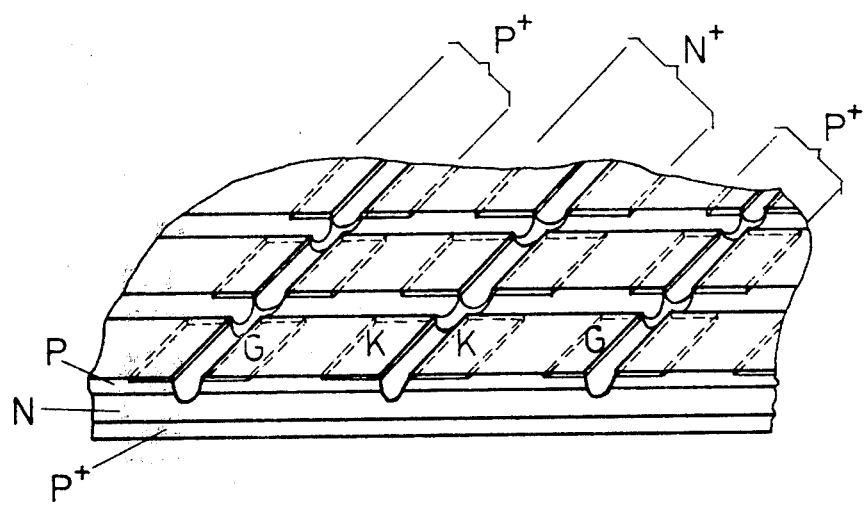
FIG. 4 is a perspective view of several semiconductor elements as in FIG. 1 produced from a single silicon wafer.

In fabrication, the P+ and N+ zones on the cathode side are diffused in strips in a silicon wafer and etched grooves provided for application of a passivating layer and division into separate elements. Thus, after division there are several identical protective elements (FIG. 4).

Figure 5:
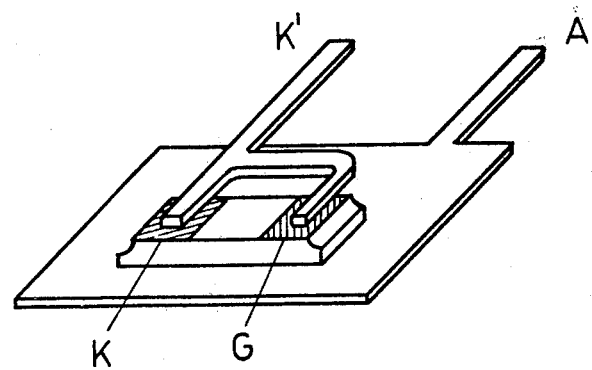
FIG. 5 is a perspective view of a semiconductor element as in FIG. 1, with contacts soldered to the anode, cathode and gate.

FIG. 5 shows a single element with electrodes soldered to it. A indicates the anode contact and K' the contact which simultaneously short circuits the cathode K and the gate G.

Figure 6:
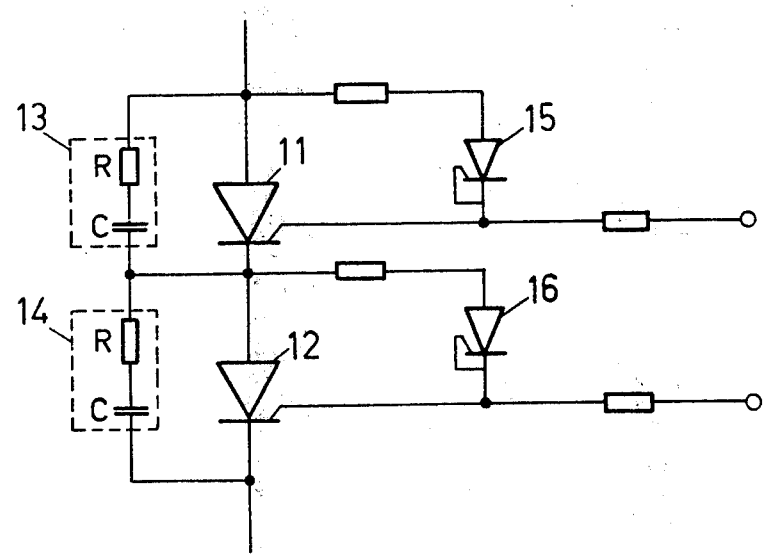
FIG. 6 is a circuit with thyristor protected by the safety device of the invention.

FIG. 6 shows an example of the application of the new element in an electrical circuit. In parallel with each of the thyristor 11 and 12 is an RC circuit, 13 and 14, by means of which the periodic rises in voltage are limited in rate. If, however, dU/dt happens to exceed this limit, protective element 15 or 16 switches on and supplies a current pulse to the gate of the thyristor, so that it fires normally.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A safety device for protecting a controllable high power semiconductor component having an anode, a cathode, and a first gate electrode, against firing by excessive voltage rise rates dU/dt impressed across the component anode and cathode electrodes, comprising:
    a semiconductor body having at least four sequential zones of alternating and opposite conductivity type, the second sequential zone being provided with a high concentration region having a higher concentration of conductivity type determining impurities than the rest of the second sequential zone, said semiconductor body further comprising, a first emitter electrode contacting the first of the four sequential zones of said semiconductor body and connected to the first gate electrode of the controllable high power semiconductor component, a second emitter electrode contacting the fourth of the four sequential zones of said semiconductor body and connected to the anode of the controllable high power semiconductor component, a second gate electrode contacting the high concentration region of the second sequential zone of said semiconductor body, and an ohmic conductor connected between said first emitter electrode and said gate electrode;

said first zone having a width $l_K$, said high concentration region of said second zone being separated from said first zone by a distance $l_S$, the lateral resistances in said second zone under said first zone being $R_K$ and in the portion between said first zone and said high concentration region being $R_S$, and said values of width $l_K$, distance $l_S$ and resistance $R_A$ being set at such values that the following equation is essentially satisfied:

$$0.6(V) = \tfrac{1}{2} j(R_K l_K^2 + R_S l_S^2) + i R_A \qquad (V)$$

wherein $$j = \frac{C}{F} \frac{dU}{dt} \text{ and } i = C \frac{dU}{dt},$$

and

C is the space charge capacity of the junction $J_2$ between said second zone and the third of the four sequential zones, F is the area of junction $J_2$, and dU/dt is less than the value of the voltage rise rate at which said protected semiconductor component would fire.

2. A safety device as in claim 1, wherein $R_A$ is made practically zero and $l_k$ and $l_S$ are adjusted to satisfy said equation.

3. A safety device as in claim 1, wherein $l_k$ and $l_S$ are chosen so small that $R_A$ has a value significantly different from zero, such that fulfillment of said equation is achieved by adjusting the value of $R_A$.

4. A safety device in claim 1, wherein:

said second zone includes a trench etched portion for increasing the value of $R_S$.

* * * * *